United States Patent [19]

Yang et al.

[11] Patent Number: 5,298,286
[45] Date of Patent: Mar. 29, 1994

[54] METHOD FOR FABRICATING DIAMOND FILMS ON NONDIAMOND SUBSTRATES AND RELATED STRUCTURES

[75] Inventors: Peichun Yang; Wei Zhu, both of Raleigh; Jeffrey T. Glass, Apex, all of N.C.

[73] Assignee: North Carolina State University, Raleigh, N.C.

[21] Appl. No.: 973,633

[22] Filed: Nov. 9, 1992

[51] Int. Cl.$^5$ .............................................. C23C 16/00
[52] U.S. Cl. .................................. 427/249; 427/372.2; 156/DIG. 68; 423/446
[58] Field of Search ................... 427/249, 372.2; 156/DIG. 68; 423/446

[56] References Cited

U.S. PATENT DOCUMENTS

| | | | |
|---|---|---|---|
| 4,062,660 | 12/1977 | Nicholas et al. | 51/295 |
| 5,075,094 | 12/1991 | Morrish et al. | 423/446 |
| 5,082,359 | 1/1992 | Kirkpatrick | 423/446 |
| 5,082,522 | 1/1992 | Purdes et al. | 423/446 |

FOREIGN PATENT DOCUMENTS

4-132687 6/1992 Japan.
8911897 12/1989 World Int. Prop. O.

OTHER PUBLICATIONS

Bovenkerk et al., "Preparation of Diamond", Nature, pp. 1094–1098, Oct. 10, 1959.
Sato et al., "Epitaxial Growth of Diamond from the Gas Phase", New Diamond Science and Technology, 1987 MRS Int. Conf. Proc., pp. 371–376.
E. Hartmann, "On the Orientation Effects of Capillary Forces", Acta Physica Academiae Scientiarum Hungaricae, Tomus 47 (1–3), pp. 185–188 (1979).
E. Hartmann, "Symmetrical Configurations by Capillary Forces", Acta Physica Academiae Scientiarum Hungaricae, Tomus 47 (1–3), pp. 189–190 (1979).
V. I. Klykov et al., "Diataxial Growth of Silicon and Germanium", Journal of Crystal Growth 52 (1981) 687–691.
D. S. Olson et al., "Growth of Diamond From Sputtered Atomic Carbon and Atomic Hydrogen", Mat. Res. Soc. Symp. Proc. vol. 270.
R. H. Wentorf, Jr., "Diamond Synthesis", General Electric Research Laboratory, Schenectady, N.Y.

Primary Examiner—Shrive Beck
Assistant Examiner—David M. Maiorana
Attorney, Agent, or Firm—Bell, Seltzer, Park & Gibson

[57] ABSTRACT

A method for making an oriented diamond film includes the steps of seeding a face of a nondiamond substrate with diamond particles, and orienting the diamond particles with respect to the substrate by heating the seeded substrate to a predetermined temperature and for a predetermined time to dissolve portions of the diamond particles into the substrate while suppressing graphite formation. Diamond may then be deposited onto the oriented diamond particles by CVD techniques to thereby form an oriented diamond film on the nondiamond substrate. The nondiamond substrate is preferably a single crystal transition metal capable of dissolving carbon. The transition metal is preferably selected from the group consisting of nickel, cobalt, chromium, magnesium, iron, and alloys thereof. For nickel as the substrate material, the temperature for orientation of the diamond particles is preferably about 1200° C., for a time period in the range of about 1 to 15 minutes, and, more preferably, about 1 to 5 minutes. Structures produced by the method are also disclosed and include the absence of a graphite layer between the diamond and the nondiamond substrate.

50 Claims, 6 Drawing Sheets

METHOD FOR FABRICATING DIAMOND FILMS ON NONDIAMOND SUBSTRATES AND RELATED STRUCTURES

FIELD OF THE INVENTION

This invention relates to the field of materials, and, more particularly, to a method for fabricating diamond films on nondiamond substrates, such as for microelectronic applications, and the structures produced according to the method.

BACKGROUND OF THE INVENTION

Diamond is a preferred material for semiconductor devices because it has semiconductor properties that are superior to conventional semiconductor materials, such as silicon, germanium or gallium arsenide. Diamond provides a higher energy bandgap, a higher breakdown voltage, and a higher saturation velocity than these traditional semiconductor materials.

These properties of diamond yield a substantial increase in projected cutoff frequency and maximum operating voltage compared to devices fabricated using more conventional semiconductor materials. For example, silicon is typically not used at temperatures higher than about 200° C. and gallium arsenide is not typically used above 300° C. These temperature limitations are caused, in part, because of the relatively small energy band gaps for silicon (1.12 eV at ambient temperature) and gallium arsenide (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, that is, diamond is a "radiation-hard" material.

Because of the advantages of diamond as a material for semiconductor devices, there is at present an interest in the growth and use of diamond for high temperature and radiation-hardened electronic devices. In particular, there is a present interest in the growth and use of single crystal diamond as a material for semiconductor devices. This interest is due in part to the increased efficiency of operation of single crystal semiconducting diamond in comparison with polycrystalline semiconducting diamond in which grain boundaries may impede the flow of charge carriers within the device.

Unfortunately, the fabrication of a single crystal diamond film is typically carried out by homoepitaxial deposition of a semiconducting diamond film on a single crystal diamond substrate. Such a single crystal diamond substrate is relatively expensive. Thus, the heteroepitaxial growth of single crystal diamond thin films on nondiamond substrates by chemical vapor deposition (CVD) has long been sought due to its enormous potential impact on the microelectronics industry.

Promising candidate substrate materials for the heteroepitaxial growth of diamond include cBN, $\beta$-SiC, BeO, Ni, Cu, Si, and a few refractory metals such as Ta, W and Mo. Nickel is one of the few materials that has a relatively close lattice match with diamond (a=3.52Å for Ni and a=3.56Å for diamond). However, apart from reports of heteroepitaxial growth of diamond films on cBN and B-SiC substrates and some limited success of growing some diamond particles oriented on nickel substrates, most experiments have yielded randomly oriented, three-dimensional diamond nuclei which are not suitable for forming a single crystal diamond film as is desirable for semiconductor applications. It is believed that the extremely high surface energy of diamond (in the range of 5.3–9.2 J/m$^2$ for the principal low index planes) and the existence of extensive interfacial misfit and strain energies between diamond films and nondiamond substrates may be the primary obstacles in forming oriented two-dimensional diamond nuclei.

It has been known for decades that nickel is an effective catalyst metal for diamond crystallization under high pressure and high temperature (HPHT) conditions. See, for example, Preparation of Diamond by Bovenkerk et al., *Nature*, pp. 1094–1098, Oct. 10, 1959. Although a detailed mechanism of the catalytic effect has not been completely developed, it is believed that its strong reactivity with carbon is essential in the catalytic HPHT diamond growth process. However, nickel's high solubility for carbon and its strong catalytic effect on hydrocarbon decomposition and subsequent graphite formation at low pressures have prevented CVD diamond nucleation on its surface without the deposition of an intermediate graphite layer.

A graphite interlayer generally forms immediately when nickel substrates are placed in a methane-hydrogen CVD environment. This has precluded the possible development of an oriented relationship between the diamond film and the nickel substrate, even though diamond might eventually nucleate and grow on the graphite interlayer. The graphite interlayer also prevents good mechanical adhesion to the underlying substrate.

Sato et al. in an article entitled *Epitaxial Growth of Diamond from the Gas Phase*, New Diamond Science and Technology, 1987 MRS Int. Conf. Proc., pp. 371–376, discloses some epitaxial diamond growth on a nickel substrate starting with a mechanical surface preparation using a diamond powder to abrade the nickel substrate surface to increase nucleation density. Nucleation density was reported to be highest for a CVD temperature in the range of 800°–900° C. during diamond deposition, although deposition was carried out in the temperature range of 500°–1000° C. Sato et al. disclose that the methane concentration must be kept below a critical value at a given substrate temperature in an attempt to suppress graphite formation.

SUMMARY OF THE INVENTION

In view of the foregoing background, it is, therefore, an object of the present invention to provide a method for forming an oriented diamond film on a nondiamond substrate, particularly to enable the growth of a single crystal diamond film on the nondiamond substrate.

It is another object of the present invention to provide a method for forming a diamond film on a nondiamond substrate using CVD techniques while avoiding the formation of graphite so as to permit formation of an oriented diamond film and/or to produce strong mechanical adhesion between the nondiamond substrate and the thus formed diamond film.

These and other objects, advantages and features of the present invention are provided by a method including the steps of forming a plurality of diamond seeds on a face of a nondiamond substrate, and orienting the diamond seeds with respect to the substrate by heating the seeded substrate to a predetermined temperature and for a predetermined time to dissolve portions of the diamond particles into the substrate while suppressing graphite formation. Diamond may then be deposited onto the oriented diamond particles by CVD techniques to thereby form an oriented diamond film on the nondiamond substrate.

By oriented diamond film is meant that the individual diamond seeds are in alignment with the lattice of corresponding portions of the nondiamond substrate. If the nondiamond substrate is a polycrystalline substrate, the oriented diamond film will also be polycrystalline. Moreover, if the nondiamond substrate is single crystal, and especially if the nondiamond substrate material has a relatively close lattice match with diamond, the oriented diamond film may be further grown into a single crystal diamond film. As would be readily understood by those skilled in the art, with proper growing conditions, individual oriented diamond seeds can be grown together so that the boundaries between adjacent growing seeds effectively disappear.

More particularly, the nondiamond substrate is preferably a single crystal transition metal capable of dissolving carbon. The transition metal is preferably selected from the group consisting of nickel, cobalt, chromium, magnesium, iron, and alloys thereof. The transition metal is more preferably selected from the group consisting of nickel, cobalt, and alloys thereof which have a relatively close lattice match to diamond. The nondiamond substrate is also preferably a single crystal substrate having a low index plane oriented face selected from the group consisting of {100}, {110}, {111}, {120}, {112}, {114}, and {221}.

For nickel, the temperature for orientation of the diamond particles is preferably in the range of about 1100° to 1300° C., and, more preferably 1200° C., for a time period in the range of about 1 to 15 minutes, and, more preferably, about 1 to 5 minutes in a hydrogen containing gas.

The substrate is also preferably annealed after forming the seeds and prior to orienting the diamond particles by heating the substrate for a time period in the range of about 20 minutes to 3 hours, and, more preferably about 30 minutes, at a temperature in the range of about 600° to 1000° C. in a hydrogen containing gas.

As would be readily understood by those skilled in the art, the step of depositing the diamond onto the oriented diamond particles preferably includes CVD by exposing the substrate to a carbon and hydrogen containing gas mixture, such as a methane and hydrogen gas mixture, while the substrate is maintained at a predetermined temperature. The methane and hydrogen gas mixture, for example, preferably includes a methane concentration in the range of about 0.1 to 1.5% by mass, and more preferably no more than about 0.5% methane by mass. As would be readily understood by those skilled in the art, other gas mixtures for CVD formation of diamond may be readily used. In addition, the CVD deposition of diamond may be carried out at conventional CVD pressures, such as in the range of about 10 to 150 Torr.

According to another aspect of the invention, the predetermined temperature during diamond deposition is preferably sufficiently high to form a liquid metal-carbon-hydrogen layer that remains on the diamond seeds during CVD. It is theorized by applicants, without their wishing to be bound thereto, that this liquid layer may be an important intermediate state to the formation of the oriented diamond film.

The plurality of diamond seeds may be formed by depositing diamond particles onto the substrate, such as by sprinkling a diamond powder onto the substrate. A diamond powder may also be used to scratch the substrate surface leaving behind diamond particles to serve as seeds. The diamond particles are preferably not greater than about 6 $\mu$m in diameter, and, more preferably, not greater than about 0.25 $\mu$m as are readily commercially available. Other approaches may also be used to form the diamond seeds on the substrate, such as electrical bias-assisted nucleation of diamond onto the substrate.

The method described above may be used to produce a structure according to the present invention including a nondiamond substrate having oriented diamond seeds partially dissolved into the face thereof. Moreover, the structure will not include an intervening graphite layer between the oriented diamond seeds and corresponding adjacent portions of the nondiamond substrate. Diamond may be deposited onto the oriented diamond seeds, such as to form a single crystal diamond layer. Viewed another way, the invention includes a structure having a diamond film with portions thereof extending into the nondiamond substrate and oriented with the lattice of the corresponding portions of the substrate. A single crystal diamond layer on a nondiamond substrate may be used for microelectronic applications. In addition, a polycrystalline diamond layer on a metal substrate may have application for coating metals with diamond, such as for high temperature applications, or for cutting or abrading applications.

DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout and the sizes of regions and layers are exaggerated for clarity.

Figure 1:
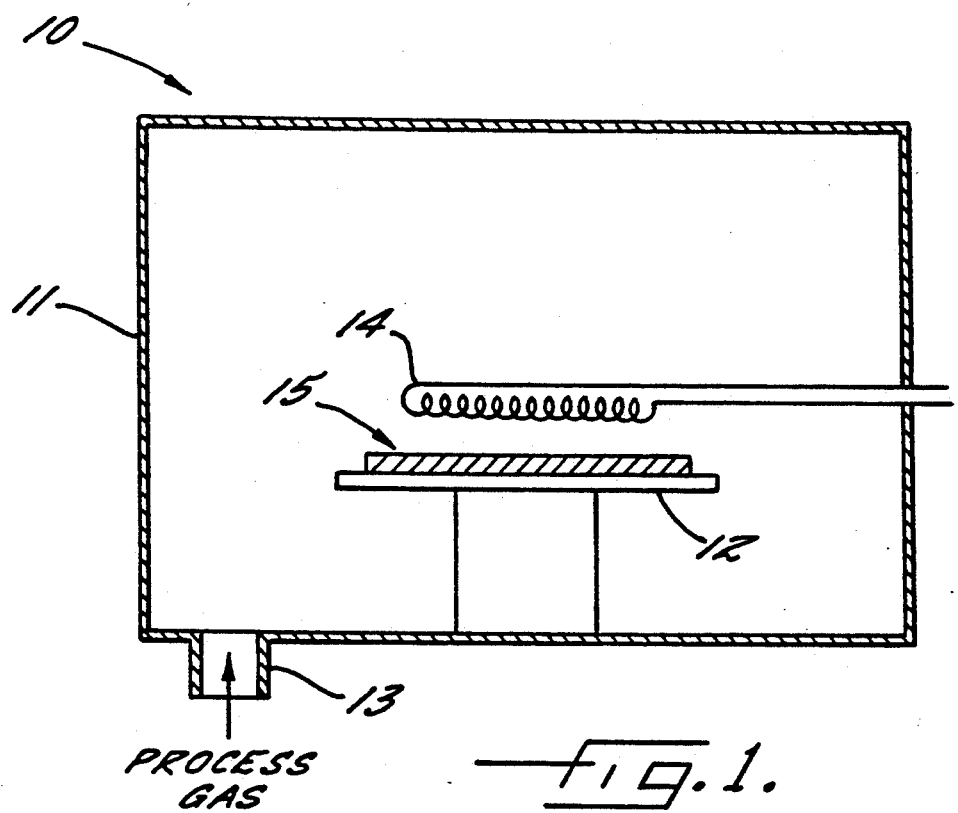
FIG. 1 is a schematic diagram of a conventional CVD reactor as used for carrying out the method according to the invention.

Referring now to FIG. 1, a conventional CVD reactor 10 for performing the multi-step deposition process according to the invention is schematically illustrated. The reactor 10 includes an evacuable chamber 11, a substrate holder 12, one or more gas ports 13, and one or more tungsten filament heaters 14, as would be readily understood by those skilled in the art. The reactor 11 may also include associated substrate temperature sensing means, not shown, such as a thermocouple or optical pyrometer as would be readily understood by those skilled in the art. As would also be readily understood by those skilled in the art, the method according to the present invention may be readily carried out using other conventional semiconductor tools, such as an ECR or microwave enhanced plasma processing chamber.

Figure 2:
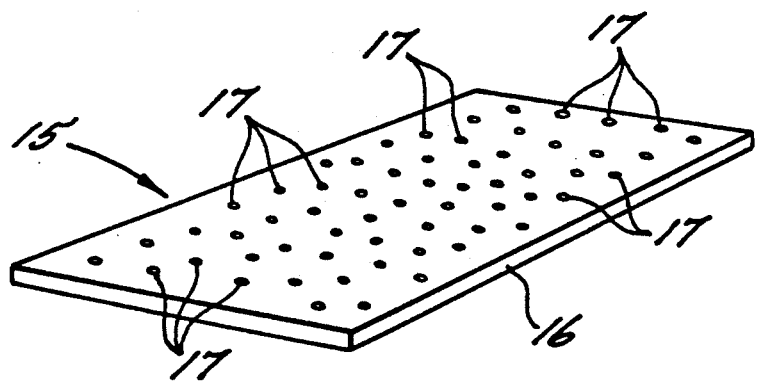
FIG. 2 is a schematic perspective view of a nondiamond substrate with diamond seeds deposited onto a face of the substrate during an intermediate step of the method according to the invention.
Figure 3:
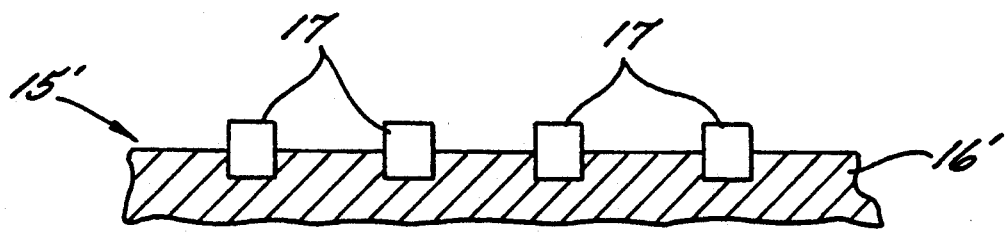
FIG. 3 is greatly enlarged schematic side cross-sectional view of the nondiamond substrate as shown in FIG. 2 after the diamond seeds have been partially dissolved into the substrate and oriented thereto during another intermediate step of the method according to the invention.
Figure 4:
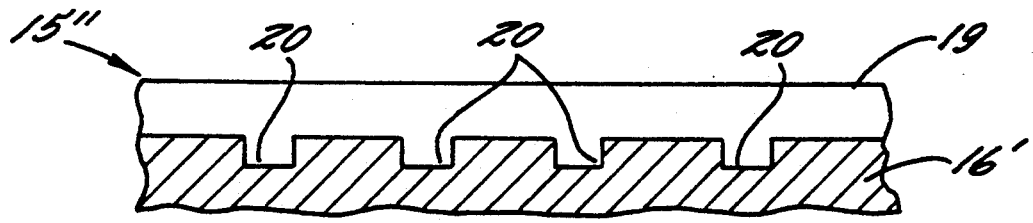
FIG. 4 is greatly enlarged schematic side cross-sectional view of the nondiamond substrate as shown in FIG. 3 after diamond has been deposited onto the seeded substrate thereby forming a single crystal diamond layer on the nondiamond substrate according to the method of the invention.

Referring now additionally to FIGS. 2-4, the method according to the invention includes the step forming a seeded substrate 15 including plurality of diamond seeds 17 on a face of a nondiamond substrate 16. The seeded substrate 15 may be formed by sprinkling a diamond powder having particles not greater than about 6 $\mu$m in diameter on the face of the substrate. More preferably, the diamond particles are not greater than about 0.25 $\mu$m. Alternately, the diamond seeds may be provided by scratching the face of the nondiamond surface with a similar diamond powder. As another option, the seeded substrate 15 may be formed by nucleating the diamond seeds using conventional techniques, such as electrical bias enhanced nucleation of diamond on a nondiamond substrate as described in commonly assigned U.S. patent application Ser. No. 07/937,481, the disclosure of which is hereby incorporated herein by reference.

The nondiamond substrate 16 preferably includes a transition metal selected from the group consisting of nickel, cobalt, chromium, magnesium, iron, and alloys thereof. More preferably, the transition metal may be selected from the group consisting of nickel, cobalt and alloys thereof which have a relatively close lattice match to diamond. These transition metals are capable of dissolving carbon and highly reactive with diamond. In the past, these metals would readily form graphite in a CVD process for growing diamond. The method according to the present invention overcomes this limitation.

The method includes the step of orienting the diamond particles 17 with respect to the substrate 16 by heating the seeded substrate 15 to a predetermined temperature and for a predetermined time to dissolve portions of the diamond particles into the substrate lattice while suppressing graphite formation to produce the structure illustrated schematically in FIG. 3. In other words, the heating, as further described below, causes the diamond seeds 17 to become partially dissolved into the face of the substrate 16' as shown in FIG. 3. Moreover, by heating the seeded substrate 15 to a predetermined temperature and for a predetermined time, that is, over a predetermined temperature-versus-time profile, graphite formation can be prevented despite the use of transition metal for the substrate that is reactive with carbon.

By preventing formation of graphite, the diamond particles 17 may be oriented with respect to the nondiamond substrate 16' (FIG. 3). In addition, the diamond seeds strongly adhere to the corresponding adjacent portions of the nondiamond substrate. For certain applications, the structure illustrated in FIG. 3 may have utility without further processing; however, for semiconductor or microelectronic applications, it is desirable to deposit diamond onto the oriented seeded substrate 15'. FIG. 4, for example, schematically illustrates diamond deposition on the structure shown in FIG. 3, such as using conventional CVD techniques to grow diamond.

More particularly, FIG. 4 illustrates a single crystal diamond layer 19 as may be readily formed on a single crystal nondiamond substrate 16', especially where the nondiamond substrate is a transition metal having a relatively close lattice match with diamond as discussed above. The single crystal diamond layer 19 thus includes portions extending into the face of the nondiamond substrate 16'. Because the diamond seeds 17 are oriented to the single crystal substrate 16', the subsequent growth of diamond thereon causes the diamond to grow together and the boundaries between adjacent growing seeds to eventually disappear thus producing the single crystal diamond layer 19 on the nondiamond substrate 16' as shown in FIG. 4. The single crystal nondiamond substrate 16' preferably has a low index plane oriented face selected from the group consisting of {100}, {110}, {111}, {120}, {112}, {114}, and {221}.

Figure 5:
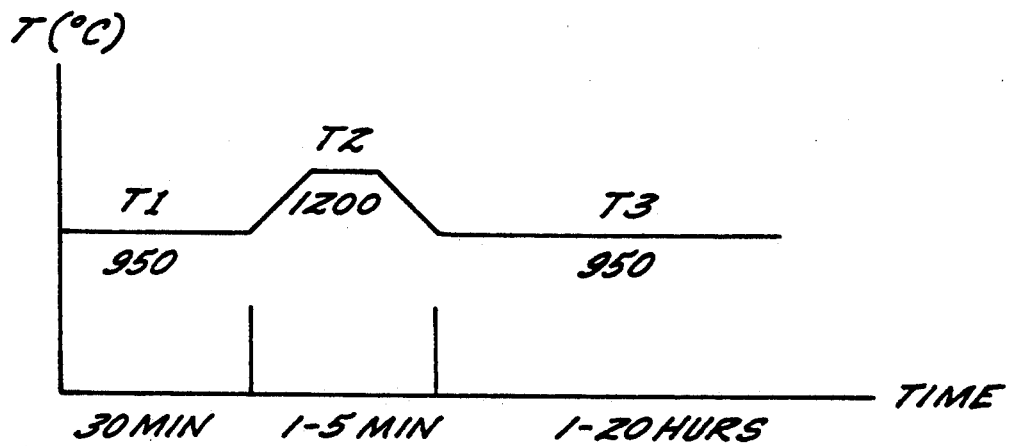
FIG. 5 is a graph illustrating substrate temperature versus time for forming an oriented diamond film on a seeded nondiamond substrate according to the present invention.

An exemplary plot of the temperature-versus-time profile for obtaining the oriented diamond seeds, as well as an annealing and diamond deposition step are shown in FIG. 5. The seeded substrate 15 is first annealed in a hydrogen containing gas at a temperature T1, preferably in the range of about 600° to 1000° C., and more preferably about 950° C. for a nickel substrate in a hydrogen containing gas. The heating is preferably carried out for a time period in the range of about 20 minutes to about 3 hours, and, more preferably, about 30 minutes as shown. The annealing step, among other things, serves to remove any oxidation from the face of the seeded substrate 15.

The seeded substrate 15, after annealing is then heated to a temperature T2 sufficient to dissolve a portion of the diamond seeds 17 into the lattice of the nondiamond substrate 16' (FIG. 3). For the instance where the substrate is nickel, the preferred temperature T2 is preferably in the range of about 1100° to 1300° C., and more preferably is about 1200°C. The desired temperature-versus-time profile also includes a ramp up and a ramp down portion that may be obtained by increasing the temperature with the titanium heater 14 and then allowing the substrate to cool as shown in FIG. 5. Other heaters may also be used as would be readily understood by those skilled in the art, especially those independently controllable from the deposition process.

After the diamond particles have been substantially oriented by the heating to the temperature T2, the diamond CVD process is carried out at a lower temperature T3. Again, for nickel, this temperature T3 is preferably in the range of about 800° to 1000° C., and more preferably about 950° C. as illustrated. It is theorized by applicants without their wishing to be bound thereto, that the temperature during deposition may further serve to orient the diamond seeds without causing the formation of graphite.

The substrate 15' is exposed to a carbon and hydrogen containing gas during the diamond deposition as would be readily understood by those skilled in the art. For example, for a methane in hydrogen gas mixture, the concentration of methane is preferably in the range of about 0.1 to 1.5% by mass, and more preferably not more than about 0.5% by mass. It is theorized by applicants without their wishing to be bound thereto, that a metal-carbon-hydrogen liquid layer forms on the undissolved diamond particles during the CVD deposition and that this may also be an important intermediate step in forming the oriented nucleation of diamond.

The following Example is included as illustrative of the present invention without being limiting thereof.

EXAMPLE

In the experiments described herein the formation of graphite was suppressed by the method according to the present invention and oriented nucleation and growth of diamond films was observed. The experiments utilized both {100} oriented single crystal nickel and polycrystalline nickel as substrates. They were scratched with 0.25 μm diamond powder and thoroughly cleaned with acetone and methanol before loading into the CVD reactor. The scratching process served as a seeding step to leave diamond fragments in the nickel surface. A seeding process by sprinkling fine diamond powders onto the nickel surface has also been utilized and proved to be effective.

These seeded substrates were then annealed at a temperature of 950° C. in a hydrogen atmosphere for approximately 30 minutes to allow for de-oxidation of the substrate surface and re-crystallization of the polycrystalline nickel substrates. The substrates were heated by radiative heating from the tungsten filaments without an external heater. All of the cited temperatures were actual surface temperatures which were calibrated by the melting points of Ge and Ni—Cu alloys, as well as thermocouples attached to the substrate surface.

After the annealing, the substrate temperature was raised to 1200° C. At this high temperature, the seeded diamond fragments started to rapidly dissolve into the nickel lattice. This process was kept to a short time (about 1 minute) to ensure that only partial dissolution occurred to the seeded diamond. These partially dissolved diamond particles are then believed to reorient themselves into alignment with the orientation of the surrounding nickel substrate due to interaction between the two lattices. This gave rise to the subsequent oriented nucleation and growth of CVD diamond films.

Finally, the temperature was lowered again to about 950° C. for continued diamond growth. The deposition parameters at this stage included a pressure of 20 Torr, a total gas flow rate of 800 sccm, and a methane concentration of 0.5% in $H_2$.

Figure 6A:
FIG. 6A is an SEM micrograph of oriented diamond nuclei formed on a <100> single crystal nickel substrate as described in the Example.
Figure 6B:
FIG. 6B is another SEM micrograph of oriented diamond nuclei formed on a <100> single crystal nickel substrate as described in the Example.
Figure 7:
FIG. 7 is an SEM micrograph of oriented diamond nuclei formed on a single grain within a <111> textured polycrystalline nickel substrate as described in the Example.

By this seeding and multi-step deposition process, well crystallized and highly oriented diamond nuclei were deposited on the nickel surface without graphite formation. Diamond nuclei with <100> orientations were observed on the {100} oriented single crystal nickel substrates as shown in FIGS. 6A and 6B. In addition, on annealed polycrystalline nickel substrates which contained large, <111> oriented, grained as confirmed by x-ray diffraction, diamond nuclei with <111> orientations were observed in these grains as shown in FIG. 7. This strongly indicates the existence of an epitaxial relationship between the diamond nuclei and the underlying nickel substrates, although detailed cross-sectional transmission electron microscopy may be necessary to more fully confirm the heteroepitaxy.

Figure 8:
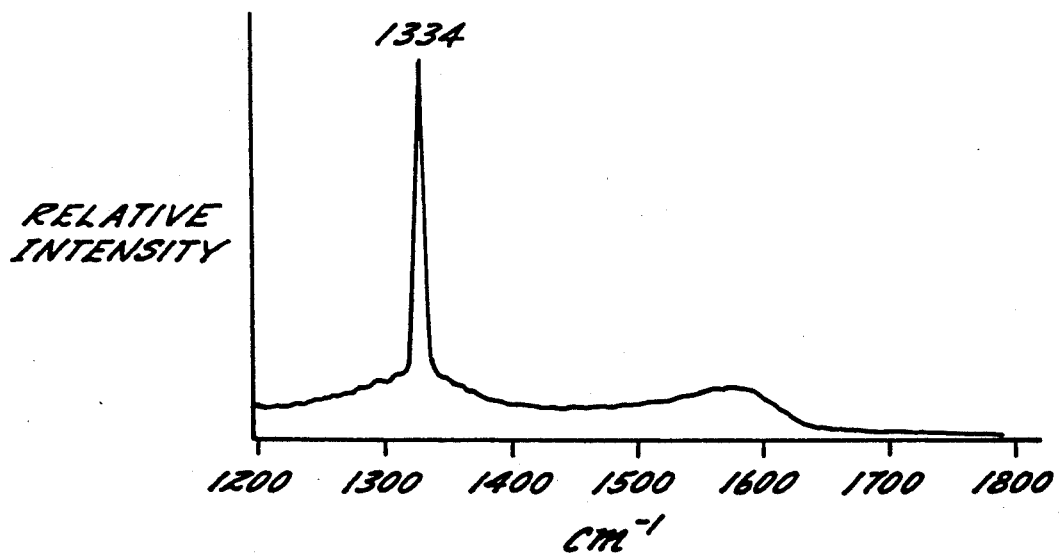
FIG. 8 is a typical Raman spectrum from the diamond nuclei as shown in FIGS. 6A-7.

A representative Raman spectrum is shown in FIG. 8 and confirms that the deposit is high quality diamond. Furthermore, no graphitic phases were detected in the substrate areas not covered by the diamond nuclei. The diamond nuclei had intimate contact with the nickel substrate as they appeared to grow from the remaining undissolved but reoriented diamond seeds embedded in the nickel surface. Flow patterns on the nickel surface, as shown by the arrows in FIG. 7, also gave evidence of melting beneath and surrounding the diamond nuclei. The fact that oriented diamond was successfully nucleated while graphite was completely suppressed was possibly related to the formation of these molten phases.

Figure 9:
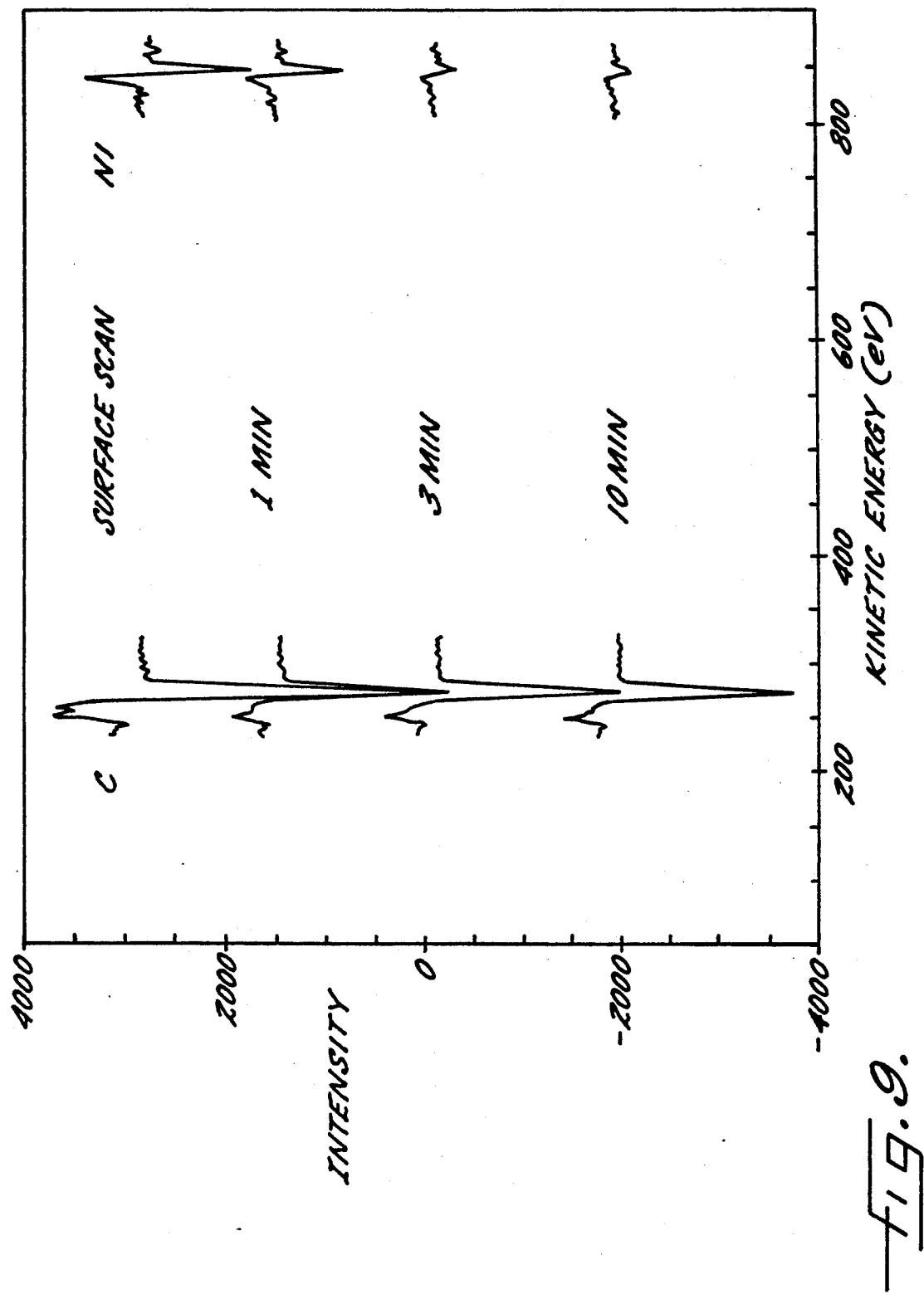
FIG. 9 is Auger Electron Spectra (AES) taken on the top of one diamond nucleus formed on a polycrystalline nickel substrate.

It was also found by micro-Auger analysis, as shown in FIG. 9, that there was a nickel layer formed on the diamond surface. However, carbon and hydrogen (the Auger signal from carbon in the Ni cannot be separated from the carbon in the diamond nuclei and hydrogen cannot be detected by Auger spectroscopy) are also likely to be incorporated into this layer considering the high solubility of carbon in nickel and the excessive amount of hydrogen in the CVD environment. Thus, it will be referred to as a Ni—C—H layer. This layer was most likely in a liquid state during the growth as evidenced from what appear to be solidified droplets observed on the diamond surface as shown in FIGS. 6A-7. Therefore, the growth of diamond films may have proceeded by the diffusion of gaseous carbon species through this liquid Ni—C—H layer to the growing diamond surface, similar to a vapor-liquid-solid (VLS) crystal growth process.

These observations of the existence of molten phases and the carbon diffusion through the Ni—C—H layer correlate closely with findings in the catalytic HPHT process. Due to nickel's unsaturated d shell electrons ($3d^84s^2$), it dissolves and reacts with both carbon and hydrogen in the methane-hydrogen CVD environment and forms nickel-carbon (or nickel-carbide) eutectic, nickel hydrides, and possibly nickel-carbon-hydrogen ternary phases. These phases have lower melting points (M.P.) than nickel (1450° C.). For example, the M.P. of nickel hydride is 1150° C. Therefore, in the present process, a material composed of nickel, carbon and hydrogen would be molten when the seeded nickel substrate was heated to 1200° C. It most probably remained molten as a very thin layer during the diamond growth. The Ni—C—H molten phase may act as an essential intermediate state to the formation of diamond as postulated in the HPHT literature.

Over-dissolution of diamond seeds by nickel may occur if the step conditions (temperature, time and rates of increasing and decreasing temperature) are not controlled properly. The parametric window for the oriented deposition of diamond films on nickel substrates appeared to be small.

The method and structure disclosed herein may be used to fabricate oriented diamond films and single crystal diamond films for microelectronics applications. Additionally, the method and structures disclosed herein may be used for producing strongly adhering diamond films on metals, such as iron, chromium and magnesium, for example. These diamond coated metals may have beneficial uses and applications outside of the microelectronics field. For example, diamond coatings may be used to transfer heat, provide mechanical protection to an underlying metal layer, or provide a cutting or abrading surface of a tool, such as a saw blade or drill bit. Accordingly, many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for forming an oriented diamond film on a nondiamond substrate, the method comprising steps of:
   providing a nondiamond substrate comprising a transition metal capable of dissolving carbon;
   forming a plurality of diamond seeds on a face of the substrate;
   heating the seeded substrate to a sufficient temperature and for a sufficient time period to dissolve portions of the diamond seeds into the face of the substrate and orient the diamond seeds with respect to the substrate while suppressing graphite formation; and
   depositing diamond onto the thus oriented diamond seeds to form an oriented diamond film on the nondiamond substrate.

2. A method according to claim 1 wherein the substrate transition metal is selected from the group consisting of nickel, cobalt, chromium, magnesium, iron, and alloys thereof.

3. A method according to claim 1 wherein the substrate transition metal is selected from the group consisting of nickel, cobalt, and alloys thereof.

4. A method according to claim 1 wherein the step of depositing diamond comprises exposing the substrate to a carbon and hydrogen containing gas while maintaining the substrate at a temperature to form a liquid metal-carbon-hydrogen layer on the diamond seeds.

5. A method according to claim 4 wherein the step of exposing the substrate to a carbon and hydrogen containing gas comprises exposing the substrate to the methane and hydrogen gas mixture including methane in the range of about 0.1 to 1.5% by mass.

6. A method according to claim 4 wherein the step of exposing the substrate to a carbon and hydrogen containing gas comprises exposing the substrate to same at a pressure in the range of about 10 to 150 Torr.

7. A method according to claim 1 wherein the nondiamond substrate is a single crystal nondiamond substrate.

8. A method according to claim 7 further comprising the step of continuing to deposit diamond onto the oriented diamond film to form a single crystal diamond film.

9. A method according to claim 7 wherein the single crystal nondiamond substrate is a single crystal nondiamond substrate having a low index plane oriented face selected from the group consisting of {100}, {111}, {120}, {112}, {114}, and {221}.

10. A method according to claim 1 wherein the predetermined time for heating the substrate is in the range of about 1 to 15 minutes.

11. A method according to claim 1 wherein the predetermined time for heating the substrate is in the range of about 1 to 5 minutes.

12. A method according to claim 1 wherein the step of forming the plurality of diamond seeds comprises depositing diamond particles not greater than about 6 $\mu m$ in diameter on the face of the substrate.

13. A method according to claim 1 wherein the step of forming the plurality of diamond seeds comprises nucleating a plurality of diamond seeds on the face of the nondiamond substrate.

14. A method according to claim 1 further comprising the step of annealing the substrate after forming the plurality of diamond seeds and prior to orienting the diamond seeds.

15. A method according to claim 13 wherein the step of annealing the substrate comprises the step of heating the substrate at a temperature in the range of about 600° to 1000° C. in a hydrogen containing gas.

16. A method according to claim 1 wherein the nondiamond substrate is a polycrystalline nondiamond substrate.

17. A method for forming a single crystal diamond film on a nondiamond substrate, the method comprising the steps of:
   providing a single crystal nondiamond substrate comprising a transition metal capable of dissolving carbon;
   forming a plurality of diamond seeds on a face of the substrate;
   orienting the diamond seeds with respect to the substrate by heating the seeded substrate to a predetermined temperature and for a predetermined time to dissolve portions of the diamond particles into the substrate while suppressing graphite formation; and
   heating the seeded substrate to a sufficient temperature and for a sufficient time period to dissolve portions of the diamond seeds into the face of the substrate and orient the diamond seeds with respect to the substrate while suppressing graphite formation; and
   depositing diamond onto the thus oriented diamond particles to form an oriented diamond film on the nondiamond substrate.

18. A method according to claim 17 wherein the substrate transition metal is selected from the group consisting of nickel, cobalt, and alloys thereof.

19. A method according to claim 17 wherein the step of depositing diamond comprises exposing the substrate to a carbon and hydrogen containing gas while maintaining the substrate at a temperature to form a liquid metal-carbon-hydrogen layer on the diamond seeds.

20. A method according to claim 19 wherein the step of exposing the substrate to a carbon and hydrogen containing gas comprises exposing the substrate to a methane and hydrogen gas mixture including methane in the range of about 0.1 to 1.5% by mass.

21. A method according to claim 19 wherein the step of exposing the substrate to a carbon and hydrogen containing gas comprises exposing the substrate to the gas at a pressure in the range of about 10 to 150 Torr.

22. A method according to claim 17 wherein the single crystal nondiamond substrate is a single crystal nondiamond substrate having a low index plane oriented face selected from the group consisting of {100}, {110}, {111}, {120}, {112}, {114}, and {221}.

23. A method according to claim 17 wherein the predetermined time for heating the substrate is in the range of about 1 to 15 minutes.

24. A method according to claim 17 wherein the predetermined time for heating the substrate is in the range of about 1 to 5 minutes.

25. A method according to claim 17 wherein the step of forming the plurality of diamond seeds comprises depositing diamond particles not greater than about 6 μm in diameter on the face of the substrate.

26. A method according to claim 17 wherein the step of forming the plurality of diamond seeds comprises nucleating a plurality of diamond seeds on the face of the nondiamond substrate.

27. A method according to claim 17 further comprising the step of annealing the substrate after forming the plurality of diamond seeds and prior to orienting the diamond seeds.

28. A method according to claim 27 wherein the step of annealing the substrate comprises the step of heating same at a temperature in the range of about 600° to 1000° C. in a hydrogen containing gas.

29. A method for forming a diamond film on a nondiamond substrate, the method comprising the steps of:
providing a nondiamond substrate comprising a transition metal capable of dissolving carbon;
forming a plurality of diamond seeds on a face of the substrate; and
heating the seeded substrate to a sufficient temperature and for a sufficient time period to dissolve portions of the diamond seeds into the face of the substrate while suppressing graphite formation.

30. A method according to claim 29 wherein the substrate transition metal is selected from the group consisting of nickel, cobalt, chromium, magnesium, iron, and alloys thereof.

31. A method according to claim 29 further comprising the step of depositing diamond onto the thus seeded substrate.

32. A method according to claim 31 wherein the step of depositing diamond comprises exposing the substrate to a carbon and hydrogen containing gas while maintaining the substrate at a temperature to form a liquid metal-carbon-hydrogen layer on the diamond seeds.

33. A method according to claim 31 wherein the step of exposing the substrate to a carbon and hydrogen containing gas comprises exposing the substrate to the methane and hydrogen gas mixture including methane in the range of about 0.1 to 1.5% by mass.

34. A method according to claim 31 wherein the step of exposing the substrate to a carbon and hydrogen containing gas comprises exposing the substrate to same at a pressure in the range of about 10 to 150 Torr.

35. A method according to claim 29 wherein the predetermined time for heating the substrate is in the range of about 1 to 15 minutes.

36. A method according to claim 29 wherein the predetermined time for heating the substrate is in the range of about 1 to 5 minutes.

37. A method according to claim 29 wherein the step of forming the plurality of diamond seeds comprises depositing diamond particles not greater than about 6 μm in diameter on the face of the substrate.

38. A method according to claim 29 wherein the step of forming a plurality of diamond seeds comprises nucleating a plurality of diamond seeds on the face of the nondiamond substrate.

39. A method according to claim 29 further comprising the step of annealing the substrate after forming the plurality of diamond seeds and prior to orienting the diamond seeds.

40. A method for forming an oriented diamond film on a nickel substrate, the method comprising the steps of:
forming a plurality of diamond seeds on a face of the nickel substrate;
orienting the diamond seeds with respect to the nickel substrate by heating the seeded nickel substrate to a temperature in the range of about 1100° to 1300° C. and for a time period in the range of about 1 to 15 minutes to dissolve portions of the diamond seeds into the face of the nickel substrate and orient the diamond seeds with respect to the nickel substrate while suppressing graphite formation; and
depositing diamond onto the thus oriented diamond particles to form an oriented diamond film on the nickel substrate.

41. A method according to claim 40 wherein the step of depositing diamond comprises exposing the substrate to a carbon and hydrogen containing gas while maintaining the substrate at a temperature to form a liquid nickel-carbon-hydrogen layer on the diamond seeds.

42. A method according to claim 40 wherein the step of exposing the substrate to a carbon and hydrogen containing gas comprises exposing the substrate to a methane and hydrogen gas mixture including methane in the range of about 0.1 to 1.5% by mass.

43. A method according to claim 41 wherein the step of exposing the substrate to a carbon and hydrogen containing gas comprises exposing the substrate to the gas at a pressure in the range of about 10 to 150 Torr.

44. A method according to claim 40 wherein the nondiamond substrate is single crystal nickel.

45. A method according to claim 44 further comprising the step of continuing to deposit diamond onto the oriented diamond film to form a single crystal diamond film.

46. A method according to claim 40 wherein the predetermined time for heating the substrate is in the range of about 1 to 15 minutes.

47. A method according to claim 40 wherein the predetermined time for heating the substrate is in the range of about 1 to 5 minutes.

48. A method according to claim 40 further comprising the step of annealing the substrate after forming the plurality of diamond seeds and prior to orienting the diamond seeds.

49. A method according to claim 48 wherein the step of annealing the substrate comprises the step of heating same at a temperature in the range of about 600° to 1000° C. in a hydrogen containing gas.

50. A method according to claim 40 wherein the nondiamond substrate is a polycrystalline nickel substrate.

* * * * *

UNITED STATES PATENT AND TRADEMARK OFFICE
CERTIFICATE OF CORRECTION

PATENT NO. : 5,298,286            Page 1 of 2

DATED : March 29, 1994

INVENTOR(S) : Yange et al.

It is certified that error appears in the above-identified patent and that said Letters Patent is hereby corrected as shown below:

Item [56] References Cited:
On the cover page, under the heading, FOREIGN PATENT DOCUMENTS, please insert --PCT-- after "World Int. Prop. O."

On the cover page, under the heading OTHER PUBLICATIONS, col. 2, line 8, please insert --1992-- after "270".
line 10, please insert --365-404-- after "N.Y."

Col. 10,    line 6, after "100" insert --110--;
             line 46, omit "and";
             line 68, insert a character space after "0.1".

UNITED STATES PATENT AND TRADEMARK OFFICE
CERTIFICATE OF CORRECTION

PATENT NO. : 5,298,286
DATED : March 29, 1994
INVENTOR(S) : Yange, et al.

It is certified that error appears in the above-indentified patent and that said Letters Patent is hereby corrected as shown below:

Col. 11, line 49, after "thus" insert --heated--.

Signed and Sealed this

Twenty-second Day of November, 1994

Attest:

BRUCE LEHMAN

*Attesting Officer*   *Commissioner of Patents and Trademarks*